United States Patent [19]

Duttweiler

[11] Patent Number: 5,025,258
[45] Date of Patent: Jun. 18, 1991

[54] ADAPTIVE PROBABILITY ESTIMATOR FOR ENTROPY ENCODING/DECODING

[75] Inventor: Donald L. Duttweiler, Rumson, N.J.

[73] Assignee: AT&T Bell Laboratories, Murray Hill, N.J.

[21] Appl. No.: 359,559

[22] Filed: Jun. 1, 1989

[51] Int. Cl.$^5$ .............................................. H03M 7/00
[52] U.S. Cl. ...................................... 341/107; 341/51; 341/76; 358/135; 375/27
[58] Field of Search ........................ 341/51, 76, 107; 358/135; 375/27

[56] References Cited

U.S. PATENT DOCUMENTS

| | | | |
|---|---|---|---|
| 4,122,440 | 10/1978 | Langdon, Jr. et al. | 341/51 |
| 4,475,227 | 10/1984 | Belfield | 375/27 |
| 4,592,070 | 5/1986 | Chow et al. | 375/27 |
| 4,633,490 | 12/1986 | Goertzel | 375/122 |
| 4,689,606 | 8/1987 | Sato | 341/107 |
| 4,725,885 | 2/1988 | Gonzales | 358/135 |
| 4,745,474 | 5/1988 | Schiff | 375/27 |
| 4,749,983 | 6/1988 | Langdon, Jr. | 341/51 |
| 4,821,290 | 4/1989 | Hingorani et al. | 341/76 |
| 4,933,883 | 6/1990 | Pennebaker et al. | 341/107 |
| 4,935,882 | 6/1990 | Pennebaker et al. | 364/554 |

OTHER PUBLICATIONS

I. H. Witten et al., "Arithmetic Coding For Data Compression", Communications of the ACM, vol. 30, No. 6, Jun. 1987, pp. 520–540.

G. G. Langdon, Jr. et al., "Compression of Black–White Images with Arithmetic Coding", IEEE Transactions on Communications, Vol-COM-29, No. 6, Jun. 1981, pp. 858–867.

W. B. Pennebaker et al., "Probability Estimation for the Q-Coder", IBM Journal of Research and Development, vol. 32, No. 6, Nov. 1988, pp. 737–752.

*Primary Examiner*—Benjamin R. Fuller
*Assistant Examiner*—Nancy Le
*Attorney, Agent, or Firm*—Thomas Stafford

[57] ABSTRACT

In entropy, e.g. arithmetic, encoding and decoding, probability estimates are needed of symbols to be encoded and subsequently decoded. More accurate probability estimates are obtained by controllably adjusting the adaptation rate of an adaptive probability estimator. The adaptation rate is optimized by matching it to the actual probability values being estimated. In particular, the adaptation rate is optimized to be proportional to the inverse of the smallest value probability being estimated. Consequently, if the probability values being estimated are not small a "fast" adaption rate is realized and if the probability values being estimated are small a necessarily slower adaptation rate is realized.

27 Claims, 2 Drawing Sheets

ADAPTIVE PROBABILITY ESTIMATOR FOR ENTROPY ENCODING/DECODING

TECHNICAL FIELD

This invention relates to the coding of signals and, more particularly, to a probability estimator for entropy encoding/decoding.

BACKGROUND OF THE INVENTION

It is known that entropy, e.g., arithmetic, encoding and decoding requires a probability estimate of the symbol to be encoded and subsequently decoded. In arithmetic encoding and decoding, more accurate probability estimates result in greater data compression. To this end, it is desirable that the probability estimates adapt to changing underlying symbol probabilities.

Prior known probability estimator arrangements have included some ability to adapt but have been limited in the adaptation rate used because of the need to estimate symbol probabilities with relatively small values. Indeed, the effective adaptation rate in prior arrangements was constant and was independent of the actual values of the probabilities being estimated. This leads to less accurate probability estimates and, consequently, lower efficiency in the encoding and decoding of the symbols.

SUMMARY OF THE INVENTION

The problems and other limitations of prior known probability estimators are overcome, in accordance with an aspect of the invention, by optimizing the rate of adaptation to the estimated probabilities of symbols to be encoded and/or decoded.

More specifically, if the values of the probabilities being estimated are not small a "fast" adaptation rate is realized in generating them and if the values of the probabilities being estimated are small a necessarily slower adaptation rate is realized in generating them.

In a specific embodiment, the adaptation rate is optimized by ideally matching it to the actual probability value being estimated. In particular, the adaptation rate is optimized to be proportional to the inverse of the smallest value probability being estimated. This is achieved, in one example, by first determining whether an at least first characteristic of a set of prescribed parameters meets a prescribed criterion, namely, whether it exceeds an at least first threshold value and if the at least first characteristic exceeds the at least first threshold value, adjusting the set of prescribed parameters in a prescribed manner.

In an exemplary embodiment, the at least first prescribed characteristic is the minimum value of the set of prescribed parameters for a given context and the at least first threshold value is a small value, for example, eight (8). Each element in the prescribed set of parameters is a function of a context sensitive accumulation, i.e., count, of received symbols.

DETAILED DESCRIPTION

Figure 1:
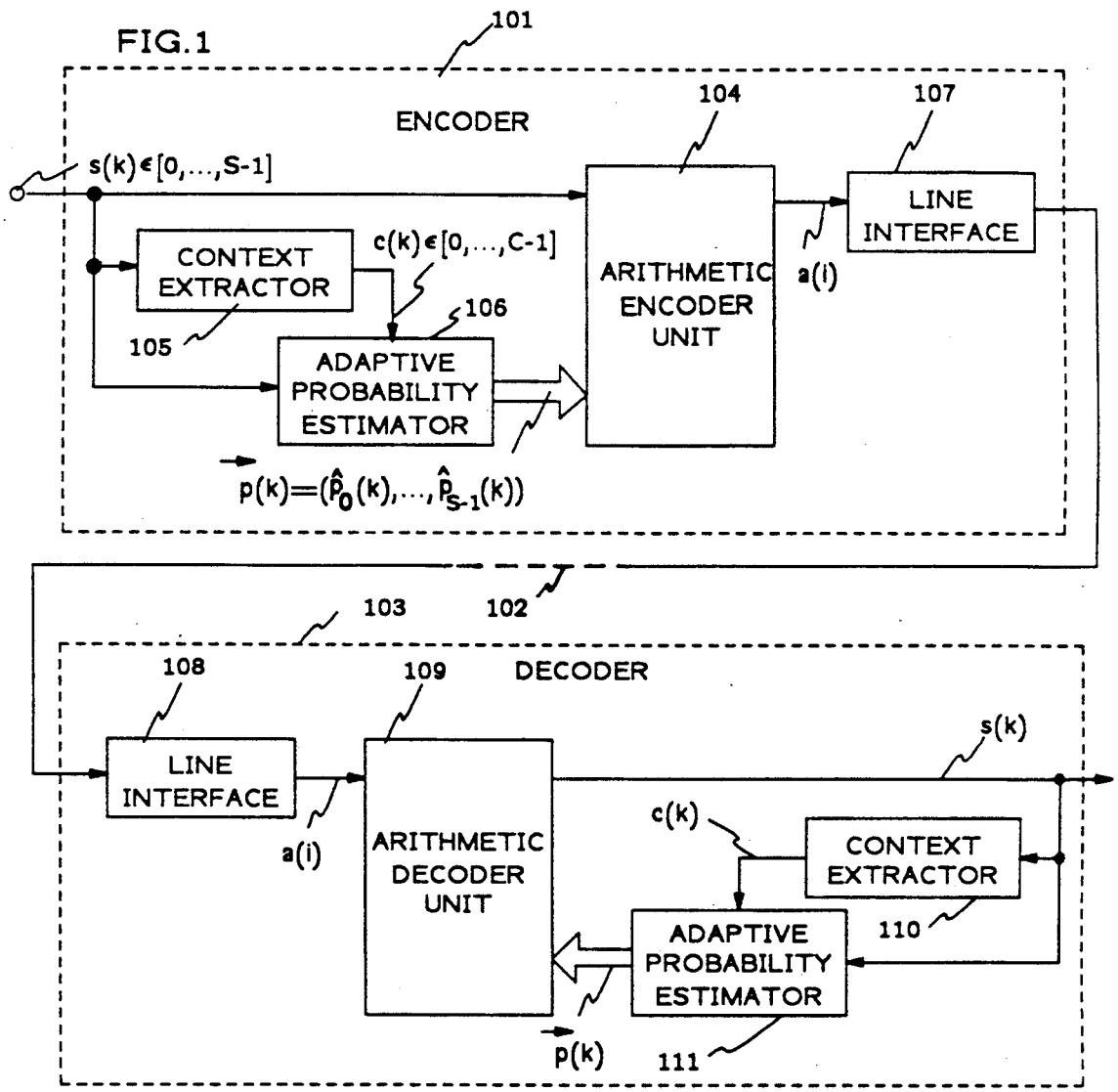
FIG. 1 shows details of an arrangement employing an encoder and remote decoder employing aspects of the invention.

FIG. 1 shows details of entropy encoder 101 in simplified block diagram form, including aspects of the invention, which receives data symbols s(k), encodes them into a data stream a(i) and interfaces them to a transmission media 102 for transmission to remote entropy decoder 103. Entropy decoder 103, also including aspects of the invention, interfaces to the transmission media to obtain the receiver data stream and decodes it into replicas of the transmitted symbols s(k). Symbols s(k) include elements [0, ..., S−1], namely, s(k) $\epsilon$ [0, ..., S−1]. Thus, the symbols may be multilevel or binary as desired.

Accordingly, encoder 101 includes, in this example, arithmetic encoder unit 104, context extractor 105, adaptive probability estimator 106 and line interface 107. Symbols s(k) and probability estimates p(k) are supplied to arithmetic encoder unit 104 and employed therein in known fashion to generate an encoded data stream a(i). Such arithmetic encoder units are known in the art. See, for example, an article entitled "Compression of Black-White Image with Arithmetic Coding", *IEEE Transactions On Communications*, VOL. COM.-29, No. 6, June 1981, pages 858–867, and U.S. Pat. No. 4,633,490 issued Dec. 30, 1986 for arithmetic encoders/decoders used to encode and decode symbols having binary elements. Also see an article entitled, "Arithmetic Coding For Data Compression", *Communications of the ACM*, Volume 30, No. 6, June 1987, pages 520–540, for an arithmetic encoder/decoder used to encode/decode symbols having multilevel elements. Line interface 107 interfaces the encoded data stream a(i) to transmission media 102 which, in turn, supplies the data stream to remote decoder 103. To this end, line interface 107 includes appropriate apparatus for formatting the data stream into the signal format employed in transmission media 102. Some well known examples of possible transmission media 102 are T-carrier trunks, ISDN basic subscriber lines, local area networks and the like. Such line interface apparatus is known in the art.

Context extractor 105 simply obtains the context c(k), where c(k) $\epsilon$ [0, ..., C-1], of received symbol s(k). That is to say, context extractor 106 generates a unique context (or state) for symbol s(k) based on prior supplied symbols. By way of example, and not to be construed as limiting the scope of the invention, for an image compression system, symbol s(k) is representative of the color of a current pixel to be encoded and the context c(k) may be determined by the colors of prescribed prior pixels. For example, the color of a pixel (P) adjacent and prior to the current pixel in the same line and the color of a pixel (A) in a prior line directly above the current pixel may advantageously be used to generate a context c(k) for symbol s(k) in a binary application. Thus, c(k) is zero (0) if both pixel P and pixel A are white; c(k) is one (1) if pixel P is white and pixel (A) is black; c(k) is two (2) if pixel P is black and pixel A is white; and c(k) is three (3) if both pixels P and A are black. Also, see the U.S. Pat. No. 4,633,490 for another context extractor (state generator) which may be employed in a binary application. It will be apparent to those skilled in the art how such binary context extractors can be extended to obtain the context for multilevel applications. A representation of the extracted context c(k) is supplied to adaptive probability estimator 106.

Adaptive probability estimator 106 is advantageously employed to generate probability estimates $p(k)=(p_0(k),\ldots p_{S-1}(k))$ for incoming symbol $s(k) \in [0,\ldots, S-1]$ and associated context $c(k) \in [0,\ldots, C-1]$. To this end, adaptive probability estimator 106 maintains an array $\{n_{s,c}\}$ having dimensionality S by C, where each element $n_{s,c}$ of the array is an accumulation, i.e., a "count", of the occurrences of symbol s in context c, and s and c are dummy indices identifying the location of $n_{s,c}$ in the array. Adaptive probability estimator 106 can be readily implemented by appropriately programming a computer or digital signal processor. It is envisioned, however, that a superior mode of implementation is in a very large scale integrated (VLSI) circuit configuration on a semiconductor chip.

Figure 2:
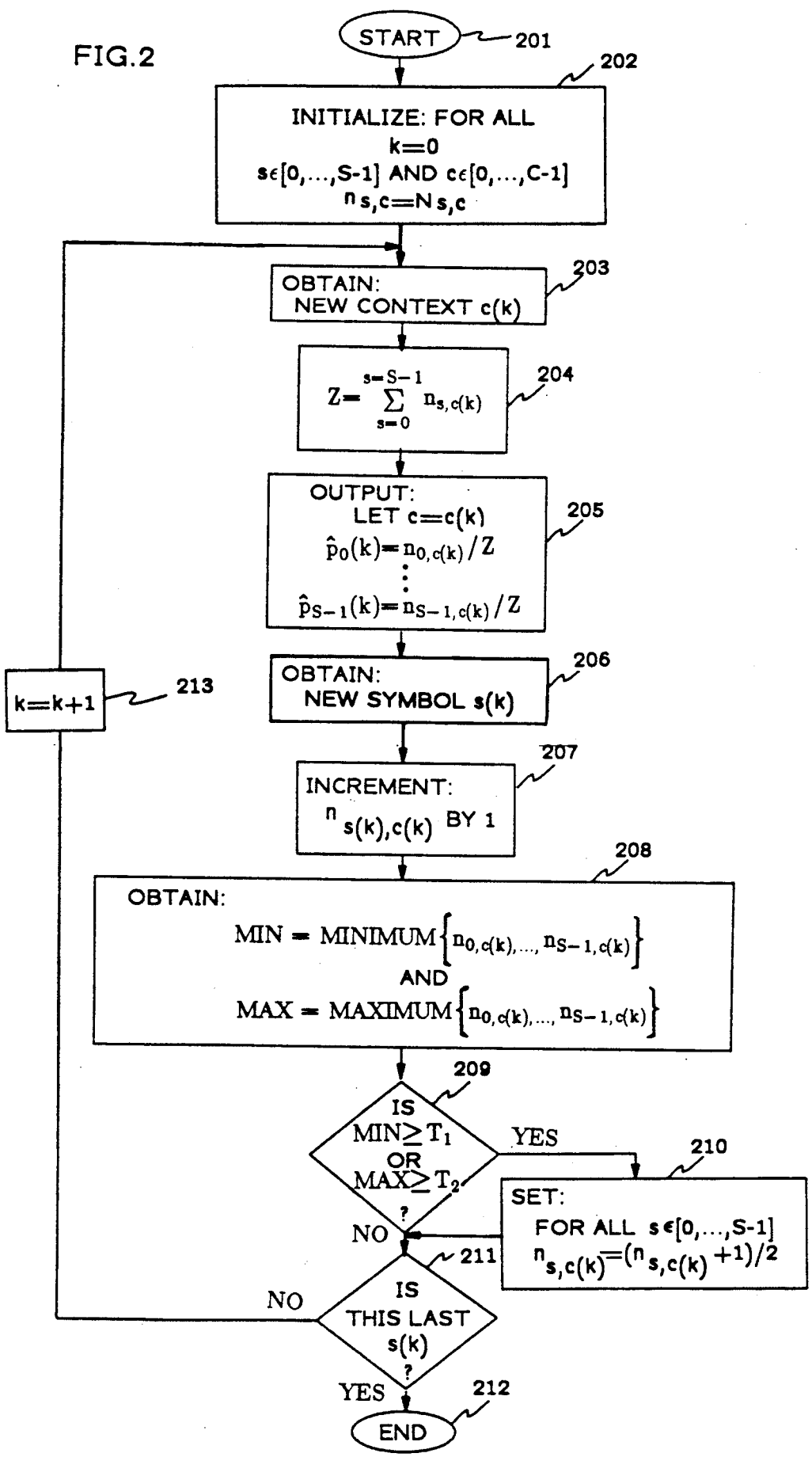
FIG. 2 depicts a flow chart illustrating the operation of elements of the adaptive probability estimator employed in the encoder and decoder shown in FIG. 1.

The flow chart shown in FIG. 2 depicts operation of elements in adaptive probability estimator 106 in generating more accurate probability estimates, in accordance with an aspect of the invention, by optimizing the rate of adaptation to the estimated probabilities of symbols to be encoded. Accordingly, operation of adaptive probability estimator 106 is started via start step 201. Thereafter, operational block 202 initializes $k=0$ and the counts of $n_{s,c}$ for all $s \in [0,\ldots, S-1]$ and $c \in [0,\ldots, C-1]$ to be $n_{s,c}=N_{s,c}$, where $N_{s,c}$ are some predetermined values. Operational block 203 obtains a new context $c(k)$. It is noted that the new context can be the same as a previously obtained context. Then, operational block 204 obtains the sum Z of the counts for the obtained context $c(k)$ for all $s \in [0,\ldots, S-1]$, namely $$Z = \sum_{s=0}^{s=S-1} n_{s,c(k)} \tag{1}$$

Operational block 205 causes adaptive probability estimator 106 (FIG. 1) to output the probability estimates which are, in turn, supplied to arithmetic encoder unit 104 (FIG. 1). Since, this is the first run these probability estimates are based only on the initialized conditions and the obtained context $c(k)$. In subsequent runs, the probability estimates are based on the sum of the counts, i.e., accumulations, of the occurrences of symbols $s(k)$ for context $c(k)$. Thus, step 205 causes the probability estimates to be output, namely, $$\leftarrow p_0(k) = n_{0,c(k)}/Z \tag{2}$$
$$\vdots$$
$$p_{S-1}(k) = n_{S-1,c(k)}/Z$$

Operational block 206 obtains symbol $s(k)$ to be encoded. Operational block 207 causes the count for the obtained symbol $s(k)$ and context $c(k)$ to be incremented by 1, namely, $n_{s(k),c(k)}$ is incremented by 1.

Operational block 208 obtains an at least first and an at least second characteristics of a prescibed set of parameters. In this example, each element of the prescibed set of parameters is a function of a context sensitive accumulation, i.e., count, of received symbols to be encoded. That is, the prescribed set of parameters are "accumulated" occurrences of the symbols $s(k)$ for context $c(k)$, namely, $n_{0,c(k)},\ldots, n_{S-1,c(k)}$. The at least first characteristic, in this example, is the minimum one of the accumulated occurrences for context $c(k)$, namely, $$MIN = MINIMUM\{n_{0,c(k)},\ldots, n_{S-1,c(k)}\}. \tag{3}$$

The at least second characteristic, in this example, is the maximum one of the accumulated occurrences for context $c(k)$, namely, $$MAX = MAXIMUM\{n_{0,c(k)},\ldots, n_{S-1,c(k)}\}. \tag{4}$$

Conditional branch point 209 tests to determine, in accordance with an aspect of the invention, if either the at least first characteristic is equal to or greater than an at least first threshold value, namely, $$MIN \geq T_1, \tag{5}$$

or the at least second characteristic is equal to or greater than at at least second threshold value, namely, $$MAX \geq T_2. \tag{6}$$

It is important to note that the use of the at least first characteristic (MIN) allows, in accordance with an aspect of the invention, the optimization of the adaptation rate of adaptive probability estimator 106 (FIG. 1). In prior arrangements, only a maximum threshold value was employed. A significant problem with such a prior arrangement is that it is necessary to use either a large threshold value so that smaller value probabilities can be represented or a small threshold value to obtain fast adaptation. The small threshold value, however, makes it impossible to represent small value probabilities. Additionally, the large value threshold leads to a relatively slow adaptation rate. These problems are resolved by advantageously employing, in accordance with an aspect of the invention, the at least first characteristic which, in this example, is MIN as set forth in equation (4) and a small threshold value $T_1$, which in this example, is eight (8). Thus, in this example, each of the possible symbol occurrences for context $c(k)$, namely, $[0,\ldots, S-1]$, must occur at least eight times before the condition of equation (5) is met. Consequently, the use of the at least first characteristic, i.e., MIN, and the at least first threshold value $T_1=8$, yields an adaptation rate that is ideally matched to the actual probability value being estimated. By way of example and not to be construed as limiting the scope of the invention, for a binary application and a probability being estimated of one-half ($\frac{1}{2}$), the accumulated occurrences are adjusted after seeing the context $c(k)$ approximately $8+8=16$ times; for a probability being estimated of one quarter ($\frac{1}{4}$), the accumulated occurrences are adjusted after seeing the context $c(k)$ approximately $8+24=32$ times; and for a probability being estimated of one-eighth ($\frac{1}{8}$), the accumulated occurrences are adjusted after seeing context $c(k)$ approximately $8+56=64$ times. Thus, it is seen that the adaptation rate is faster for the larger (not small) probability values being estimated and is necessarily slower for the smaller probability values being estimated. The adaptation rate adjustment will be apparent from steps 209 and 210.

The at least second characteristic, in this example, MAX in accordance with equation (4), is employed in conjunction with the at least second threshold value $T_2$ to assure against arithmetic overflow in the accumulation of the occurrences of symbols $s(k)$ in context $c(k)$. Unless one of the probabilities being estimated has an unusually small value, MAX will not be the characteristic that causes the parameter adjustment. In one example, the value of $T_2$ is 2048. It is noted that other characteristics of the set of parameters may also be employed. For example, the sum Z obtained in step 204 could be used in place of MAX.

Thus, returning to step 209 if the prescribed criterion of either the condition of equation (5) (MIN≧$T_1$) or the condition of equation (6) (MAX≧$T_2$) is met, operational block 210 causes an adjustment in the accumulated symbol elements in context c(k). In this example, the adaptation rate adjustment is realized by step 210 in conjunction with step 209 causing a proportionate adjustment of the accumulated values, i.e., counts a so-called halving of the accumulated occurrences for context c(k) for all s ϵ [0, ..., S−1], namely, setting $$n_{s,c(k)} = (n_{s,c(k)} + 1)/2. \tag{7}$$

Although in this embodiment the counts are proportionately adjusted in the same manner when the condition of either equation (5) or equation (6) is met, it would be advantageous in some applications to adjust the counts differently for each of the above conditions. This adjustment proportionately of the accumulated occurrences makes the probability estimates more dependent on more recent occurrences of the symbols in context c(k). Thus, as implied above, by causing, in accordance with an aspect of the invention, the adjustment of the accumulated occurrences to occur in accordance with equation (5), i.e., MIN≧$T_1$, the adaptation rate is ideally matched to the actual probabilities being estimated. Again, the adjustment of the accumulated occurrences of symbols s(k) in context c(k) which occurs in response to equation (6), i.e., MAX≧$T_2$, is to protect against a possible arithmetic overflow condition in the rare situation when a very small probability value is being estimated.

Thereafter, conditional branch point 211 tests to determine if the symbol s(k) is the last symbol to be encoded/decoded. It is noted that the number of symbols to be encoded is typically known. If not known an indication of the number of symbols would be supplied to adaptive probability estimator 106. If the test result in step 211 is YES, the operation of the elements of adaptive probability estimator 106 is ended via END step 212. If the test result in step 211 is NO, control is returned to step 203 and appropriate ones of steps 203 through 211 are iterated until step 211 yields a YES result.

Returning to step 209, if the test result is NO, control is transferred to step 211 to determine if the symbol s(k) is the last symbol to be encoded (decoded). Again, if the test result in step 211 is YES, the operation of the elements of adaptive probability estimator 106 is ended via END step 212. If the test result in step 211 is NO, increment index k by 1 in step 213, control is returned to step 203 and appropriate ones of steps 203 through 211 are iterated until step 211 yields a YES result.

Decoder 103 includes, in this example, line interface 108, arithmetic decoder unit 109, context extractor 110 and adaptive probability estimator 111. Line interface 108 performs the inverse function of line interface 107 and deformats the incoming signal, in a known manner, to obtain the data stream a(i). Arithmetic decoder unit 109 performs the inverse function of arithmetic encoder unit 104. To this end, the received data stream a(i) and probability estimates p (k) from adaptive probability estimator 110 are supplied to arithmetic decoder unit 109 and used therein in known fashion to obtain the symbols s(k). Again, such arithmetic decoder units are known in the art. See again the article entitled "Compression of Black-White Image with Arithmetic Coding" and U.S. Pat. No. 4,633,490, cited above, regarding binary applications and the article entitled "Arithmetic Coding For Data Compression", also cited above, for multilevel applications. Context extractor 110 is identical to context extractor 105 in structure and operation and is not described again. Similarly, adaptive probability estimator 111 is identical to adaptive probability estimator 106 in structure and operation and is not described again.

I claim:

1. An adaptive probability estimator for generating probability estimates of a supplied signal having a plurality of symbol values in a supplied context to be used in entropy encoding/decoding, comprising:
   a source of the supplied signal;
   means for obtaining representations of accumulated occurrences of individual symbol values of said supplied signal in said supplied context; and
   means responsive to said representations of accumulated occurrences for adjusting a rate of adaptation of the adaptive probability estimator in accordance with a prescribed criterion, said means for adjusting including means for obtaining at least a first prescribed characteristic of said representations of accumulated occurrences and means responsive to said first prescribed characteristic for proportionately adjusting said representations of accumulated occurrences when said first prescribed characteristic meets said prescribed criterion.

2. The adaptive probability estimator as defined in claim 1 wherein said at least first prescribed characteristic is dependent on one of said representations of individual representations of accumulated occurrences associated with a symbol value that has occurred least often in said supplied context.

3. The adaptive probability estimator as defined in claim 1 wherein said at least first prescribed characteristic is the minimum one of said individual representations of accumulated occurrences.

4. The adaptive probability estimator as defined in claim 3 wherein said first prescribed criterion comprises said at least prescribed characteristic exceeding a first threshold.

5. The adaptive probability estimator as defined in claim 1 further including means for obtaining an at least second prescribed characteristic of said representations of accumulated occurrences and means for utilizing said at least second characteristic to limit values of said individual representations of accumulated occurrences.

6. The adaptive probability estimator as defined in claim 5 wherein said at least prescribed second characteristic is one of said representations of accumulated occurrences having a maximum value in said supplied context and said means for utilizing said at least second prescribed characteristic includes means responsive to said at least second prescribed characteristic to limit said representations of accumulated occurrences when said at least second prescribed characteristic exceeds a second threshold.

7. An adaptive encoder for encoding a supplied signal having a plurality of symbol value including,
   a source of the supplied signal,
   means for extracting a context of the supplied signal, adaptive probability estimator means supplied with said signal and said context for generating probability estimates of the supplied signal, entropy encoder means supplied with said signal and responsive to said probability estimates for generating an encoded version of said supplied signal, means for interfacing said encoded version as an output to a medium, said adaptive probability estimator means being characterized by means for obtaining representations of accumulated occurrences of individual symbol values of said supplied signal in said supplied context, and means responsive to said representations of accumulated occurrences for adjusting a rate of adaptation of the adaptive probability estimator in accordance with a prescribed criterion, said means for adjusting including means for obtaining at least a first prescribed characteristic of said representations of accumulated occurrences and means responsive to said first prescribed characteristic for proportionately adjusting said representations of accumulated occurrences when said first prescribed characteristic meets said prescribed criterion.

8. The adaptive encoder as defined in claim 7 wherein said at least first prescribed characteristic is dependent on one of said individual representations of accumulated occurrences associated with a symbol value that has occurred least often in said supplied context.

9. The adaptive encoder as defined in claim 7 wherein said at least first prescribed characteristic is the minimum one of said individual representations of accumulated occurrences.

10. The adaptive encoder as defined in claim 9 wherein said prescribed criterion comprises said at least first prescribed characteristic exceeding a first threshold.

11. The adaptive encoder as defined in claim 7 further including means for obtaining an at least second prescribed characteristic of said representations of accumulated occurrences and means for utilizing said at least second characteristic to limit values of said individual representations of accumulated occurrences.

12. The adaptive encoder as defined in claim 11 wherein said at least second prescribed characteristic is one of said representations of accumulated occurrences having a maximum value in said supplied context and said means for utilizing said at least second prescribed characteristic includes means responsive to said at least second prescribed characteristic to limit said representations of accumulated occurrences when said at least second prescribed characteristic exceeds a second threshold.

13. The adaptive encoder as defined in claim 7 wherein said means for interfacing said encoded version to a medium includes means for interfacing the encoder to a transmission line.

14. An adaptive decoder for reconstructing an original signal having a plurality of symbol values from a compressed data signal including, means for interfacing to a medium for obtaining the compressed data signal, means for determining a context for the symbol to be reconstructed, adaptive probability estimator means supplied with a reconstructed signal and said context for generating probability estimates of the reconstructed signal, entropy decoder means supplied with said compressed data signal and responsive to said probability estimates for reconstructing an original signal, said adaptive probability estimator means being characterized by means for obtaining representations of accumulated occurrences of individual symbol values of said supplied signal is said supplied context, and means responsive to said representations of accumulated occurrences for adjusting a rate of adaptation of the adaptive probability estimator in accordance with a prescribed criterion, said means for adjusting including means for obtaining at least a first prescribed characteristic of said representations of accumulated occurrences and means responsive to said first prescribed characteristic for proportionately adjusting said representations of accumulated occurrences when said first prescribed characteristic meets said prescribed criterion.

15. The adaptive decoder as defined in claim 14 wherein said at least first prescribed characteristic is dependent on one of said individual representations of accumulated occurrences associated with a symbol value that has occurred least often in said supplied context.

16. The adaptive decoder as defined in claim 14 wherein said at least first prescribed characteristic is the minimum one of said individual representations of accumulated occurrences.

17. The adaptive decoder as defined in claim 16 wherein said prescribed criterion comprises said at least first prescribed characteristic exceeding a first threshold.

18. The adaptive decoder as defined in claim 14 further including means for obtaining an at least second prescribed characteristic of said representations of accumulated occurrences and means for utilizing said at least second prescribed characteristic to limit values of said individual representations of accumulated occurrences.

19. The adaptive decoder as defined in claim 18 wherein said at least second prescribed characteristic is one of said representations of accumulated occurrences having a maximum value in said supplied context and said means for utilizing said at least second prescribed characteristic includes means responsive to said at least second prescribed characteristic to limit said representations of accumulated occurrences when said at least second prescribed characteristic exceeds a second threshold.

20. The adaptive decoder as defined in claim 14 wherein said means for interfacing includes means for interfacing to a transmission line.

21. A method of encoding a supplied signal having a plurality of symbol values including the steps of, extracting a context from said supplied signal dependent on a configuration of prior symbols of said supplied signal, generating probability estimates of said supplied signal in response to said supplied signal and said context, entropy encoding said supplied signal in response to said supplied signal and said probability estimates to generate an encoded version of said supplied signal, interfacing said encoded version to a medium, said step of generating probability estimates being characterized by obtaining representations of accumulated occurrences of individual symbol values of said supplied signal in said context, and adaptively adjusting a rate of adaptation in generating said probability estimates in response to said representations of accumulated occurrences in accordance with a prescribed criterion, said step of adaptively adjusting including the steps of obtaining at least a first prescribed characteristic of said representations of accumulated occurrences and in response to said first prescribed characteristic proportionately adjusting said representations of accumulated occurrences when said prescribed characteristic meets said first prescribed criterion.

22. A method of decoding a compressed data signal representative of an encoded version of an original supplied signal to obtain a reconstructed signal having a plurality of symbol values including the steps of, interfacing to a medium for obtaining the compressed data signal, extracting a context from a reconstructed signal dependent on a configuration of prior symbols of said reconstructed signal, generating probability estimates of said reconstructed signal in response to said reconstructed signal and said context, entropy decoding said compressed data signal in response to said compressed data signal and said probability estimates to generate said reconstructed signal version of the original signal, said step of generating probability estimates being characterized by obtaining representations of accumulated occurrences of individual symbol values of said supplied signal in said context, and adaptively adjusting a rate of adaptation in generating said probability estimates in response to said representations of accumulated occurrences in accordance with a prescribed criterion, said step of adaptively adjusting including the steps of obtaining at least a first prescribed characteristic of said representations of accumulated occurrences and in response to said prescribed characteristic proportionately adjusting said representations of accumulated occurrences when said prescribed characteristic meets said first prescribed criterion.

23. An adaptive probability estimator for generating probability estimates of a supplied signal having a plurality of symbol values in a supplied context to be used in entropy encoding/decoding, comprising:

a source of the supplied signal;

means for obtaining a representation of a number of occurrences of a symbol value of said supplied signal in said supplied context which has occurred least often; and means responsive to said obtained representation for adjusting a rate of adaptation of the adaptive probability estimator in accordance with a prescribed criterion, said means for adjusting including means responsive to said obtained representation for proportionately adjusting said obtained representation when said prescribed criterion is met.

24. An adaptive encoder for encoding a supplied signal having a plurality of symbol values including, a source of the supplied signal, means for extracting a context of said supplied signal, adaptive probability estimator means supplied with said signal from said source and said context for generating probability estimates of the supplied signal, entropy encoder means supplied with said signal from said source and responsive to said probability estimates for generating an encoded version of said supplied signal, and means for interfacing said encoded version as an output to a medium, said adaptive probability estimator means being characterized by means for obtaining a representation of a number of occurrences of a symbol value of said supplied signal in said supplied context which has occurred least often, and means responsive to said obtained representation for adjusting a rate of adaptation of the adaptive probability estimator in accordance with a prescribed criterion, said means for adjusting including means responsive to said obtained representation for proportionately adjusting said obtained representation when said prescribed criterion is met.

25. An adaptive decoder for reconstructing an original signal having a plurality of symbol values from a compressed data signal including, means for obtaining the compressed data signal from a medium, means for determining a context for the symbol to be reconstructed, adaptive probability estimator means supplied with a reconstructed signal and said context for generating probability estimates of the reconstructed signal, entropy decoder means supplied with said obtained compressed data signal and responsive to said probability estimates for reconstructing an original signal, said adaptive probability estimator means being characterized by means for obtaining a representation of a number of occurrences of a symbol value of said reconstructed signal in said context which has occurred least often, and means responsive to said obtained representation for adjusting a rate of adaptation of the probability estimator in accordance with a prescribed criterion, said means for adjusting including means responsive to said obtained representation for proportionately adjusting said obtained representation when said prescribed criterion is met.

26. A method of encoding a supplied signal having a plurality of symbol values including the steps of, obtaining symbol values of said supplied signal from a signal source, extracting a context from said supplied signal dependent on a configuration of prior symbols of said supplied signal, generating probability estimates of said supplied signal in response to said supplied signal and said context, entropy encoding said symbols of the supplied signal in response to said supplied signal and said probability estimates to generate an encoded version of said supplied signal, supplying said encoded version to a medium, said step of generating probability estimates being characterized by obtaining a representation of a number of occurrences of a symbol value of said supplied signal in said context which has occurred least often, and adaptively adjusting a rate of adaptation in generating said probability estimates in accordance with a prescribed criterion in response to said obtained representation by proportionately adjusting said obtained representation when said criterion is met.

27. A method of decoding a compressed data signal representative of an encoded version of an original supplied signal to obtain a reconstructed signal having a plurality of symbol values including the steps of, obtaining a compressed data signal from a medium, extracting a context from a reconstructed signal dependent on a configuration of prior symbols of said reconstructed signal, generating probability estimates of said reconstructed signal in response to said reconstructed signal and said context, entropy decoding said obtained compressed data signal in response to said compressed data signal and said probability estimates to generate said reconstructed signal version of the original signal, said step of generating probability estimates being characterized by obtaining a representation of a number of occurrences of a symbol value of said reconstructed signal in said context which has occurred least often, and adaptively adjusting a rate of adaptation in generating said probability estimates in accordance with a prescribed criterion in response to said obtained representation by proportionately adjusting said obtained representation when said criterion is met.

* * * * *

UNITED STATES PATENT AND TRADEMARK OFFICE
CERTIFICATE OF CORRECTION

PATENT NO. : 5,025,258
DATED : June 18, 1991
INVENTOR(S) : D. L. Duttweiler

It is certified that error appears in the above-identified patent and that said Letters Patent is hereby corrected as shown below:

In the claims: Claim 21, column 9, line 13, "said prescribed" should read -- said first prescribed --;

Claim 22, column 9, line 45, "said prescribed" should read -- said first prescribed--.

Claim 22, column 9, line 46, after " meets said" delete --first--.

Signed and Sealed this

Third Day of August, 1993

Attest:

MICHAEL K. KIRK

*Attesting Officer*      *Acting Commissioner of Patents and Trademarks*